US010211132B2

(12) United States Patent
Chang et al.

(10) Patent No.: US 10,211,132 B2
(45) Date of Patent: *Feb. 19, 2019

(54) PACKAGED SEMICONDUCTOR DEVICE HAVING MULTI-LEVEL LEADFRAMES CONFIGURED AS MODULES

(71) Applicant: Texas Instruments Incorporated, Dallas, TX (US)

(72) Inventors: Chia-Yu Chang, Chung Ho (TW); Chih-Chien Ho, Chung Ho (TW); Steven Su, Chung Ho (TW)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/924,767

(22) Filed: Mar. 19, 2018

(65) Prior Publication Data

US 2018/0211905 A1 Jul. 26, 2018

Related U.S. Application Data

(63) Continuation of application No. 14/973,927, filed on Dec. 18, 2015, now Pat. No. 9,922,908.

(51) Int. Cl.
*H01L 23/495* (2006.01)
*H01L 21/00* (2006.01)
(Continued)

(52) U.S. Cl.
CPC ........ *H01L 23/49551* (2013.01); *H01L 23/13* (2013.01); *H01L 23/3107* (2013.01); *H01L 23/3157* (2013.01); *H01L 23/49503* (2013.01); *H01L 23/49517* (2013.01); *H01L 23/49534* (2013.01); *H01L 23/49575* (2013.01); *H01L 23/3121* (2013.01); *H01L 23/4952* (2013.01); *H01L 24/48* (2013.01); *H01L 2224/45015* (2013.01); *H01L 2224/45144* (2013.01); *H01L 2224/45147* (2013.01);
(Continued)

(58) Field of Classification Search
CPC ........... H01L 23/3107; H01L 23/49575; H01L 23/49503; H01L 23/49537; H01L 23/49551; H01L 23/4952; H01L 21/78; H01L 24/97
See application file for complete search history.

(56) References Cited

U.S. PATENT DOCUMENTS 6,917,097 B2 7/2005 Chow et al.
7,790,500 B2 * 9/2010 Ramos .................... H01L 24/40
257/676

(Continued)

*Primary Examiner* — Alonzo Chambliss
(74) *Attorney, Agent, or Firm* — Dawn Jos; Charles A. Brill; Frank D. Cimino

(57) ABSTRACT

A leadframe (100) comprises a frame (101) of sheet metal in a first planar level, where the frame has metallic leads (110) and a first metallic pad (120) extending inward from the frame, and the first pad is tied to the frame by first metallic straps (120a). The leadframe further has a second metallic pad (130) in a second planar level parallel to and spaced from the first level, where the second pad is tied by second metallic straps (132) to the frame. In addition, the leadframe has a third metallic pad (140) in a third planar level parallel to and spaced from the second level and additively from the first level, where the third pad is tied by third metallic straps (131) to the second pad.

16 Claims, 4 Drawing Sheets

(51) Int. Cl.
*H05K 7/18* (2006.01)
*H01L 23/31* (2006.01)
*H01L 23/13* (2006.01)
*H01L 23/00* (2006.01)

(52) U.S. Cl.
CPC ............... *H01L 2224/48091* (2013.01); *H01L 2224/48247* (2013.01); *H01L 2224/48465* (2013.01); *H01L 2924/1033* (2013.01); *H01L 2924/10253* (2013.01); *H01L 2924/10271* (2013.01); *H01L 2924/10329* (2013.01); *H01L 2924/14* (2013.01); *H01L 2924/19105* (2013.01)

(56) References Cited

U.S. PATENT DOCUMENTS

| | | |
|---|---|---|
| 9,922,908 B2 * | 3/2018 | Chang ............... H01L 23/49551 |
| 2006/0035414 A1 | 2/2006 | Park et al. |
| 2013/0249051 A1 | 9/2013 | Saye |
| 2014/0210062 A1 | 7/2014 | Miyazaki |
| 2015/0160087 A1 | 6/2015 | Foong et al. |
| 2015/0099329 A1 | 7/2015 | Saye |
| 2015/0243588 A1 | 8/2015 | Edwards et al. |

* cited by examiner

PACKAGED SEMICONDUCTOR DEVICE HAVING MULTI-LEVEL LEADFRAMES CONFIGURED AS MODULES

This application is a continuation of application Ser. No. 14/973,927, filed Dec. 18, 2015, now U.S. Pat. No. 9,922,908, which is hereby incorporated by reference for all that it discloses.

FIELD

Embodiments of the invention are related in general to the field of semiconductor devices and processes, and more specifically to the structure and fabrication method of leadframes with assembly pads situated at more than one level.

DESCRIPTION OF THE RELATED ART

A metallic leadframe for semiconductor devices provides an assembly pad as stable support for firmly positioning the semiconductor chip, and further offers a multitude of leads for bringing electrical conductors into close proximity of the chip. The remaining gaps between the tip of the leads and the chip terminals are typically bridged by thin wires (commonly copper or gold, about 25 µm diameter).

For reasons of easy and cost-effective manufacturing, it is common practice to manufacture single piece leadframes from flat thin sheets of metal such as copper (typical thickness range 120 to 250 µm). The desired shape of the leadframe is etched or stamped from the original flat sheet. For most purposes, the length of a typical lead is considerably longer than its width.

For technical reasons of wire bonding it is often desirable to position the chip mount pad in a horizontal plane about 10 to 20 µm downset from the starting plane of the leads; in some devices, the height difference may be greater. Consequently, those straps which connect the chip mount pad with the frame have to be bent to overcome the required height difference between the two parallel planes.

Semiconductor devices which dissipate high power or are used in high frequency telecommunications often need to be packaged so that the package allows the leadframe to expose the chip assembly pad at the bottom surface of the package in order to facilitate direct attachment of the pad to external heat sinks. In these devices, the distance between the horizontal plane of the chip mount pad and the horizontal plane of the leads (measured along a line at right angles with the planes) increases significantly. In packages with a final thickness of about 1.0 mm, the distance may be between 400 and 500 µm. This challenge can usually be met by elongation while staying within the limits of material characteristics (for instance, for copper less than about 8%), if the distance is bridged by the strap at an inclination angle of 30° or less.

SUMMARY

For many device families with chips encapsulated in standard thickness packages (>1.0 mm), the market in electronics equipment and applications calls for devices, where packages expose the chip assembly pad for effective heat dissipation, even for large chip areas and sometimes multi-chip assembly. In addition, the packages should have small footprint. Applicants recognized that in order to expose chip mount pads in packages of more than about 1.0 mm thickness, the direct distance between the horizontal plane of the chip mount pad and the horizontal plane of the leads increases up to 260% over the respective distance in "thin" packages (into the 1100 to 1200 µm range). As a consequence for standard thickness packages, a copper strap elongation of more than 8% would be required, which is beyond the elastic limit of copper leadframe materials and would result in segment cracking and breaking.

Applicants further saw that similar difficulties arise in packages when the direct distance between the planes of the chip pad and the leads has to be bridged at angles steeper than 30°, for instance 45°. Often, this steep angle is a consequence of the desire to shrink the outline of a package, i.e. the area it consumes when mounted on a printed wiring board, or to accommodate an extra-large chip pad in a fixed package. Here again, a copper strap elongation of more than 8% would be required, which is beyond the elastic limit of copper leadframe materials.

Applicants solved the footprint problem when they discovered a methodology to distribute the assembly pads over more than one level and thus widen the concept of three-dimensional leadframes. One embodiment of the invention is a leadframe with the frame and a plurality of leads in a first horizontal plane, a first chip mount in a second horizontal plane, a second chip mount pad in a third horizontal plane, and a plurality of straps connecting the chip mount pads and the frame. The plurality of straps has a geometry designed so that the straps can accommodate bending and stretching in the forming process beyond the limit of simple elongation based upon inherent material characteristics. At least one of the chip mount pads extends to and through the encapsulating plastic package.

DETAILED DESCRIPTION OF PREFERRED EMBODIMENTS

Figure 1:
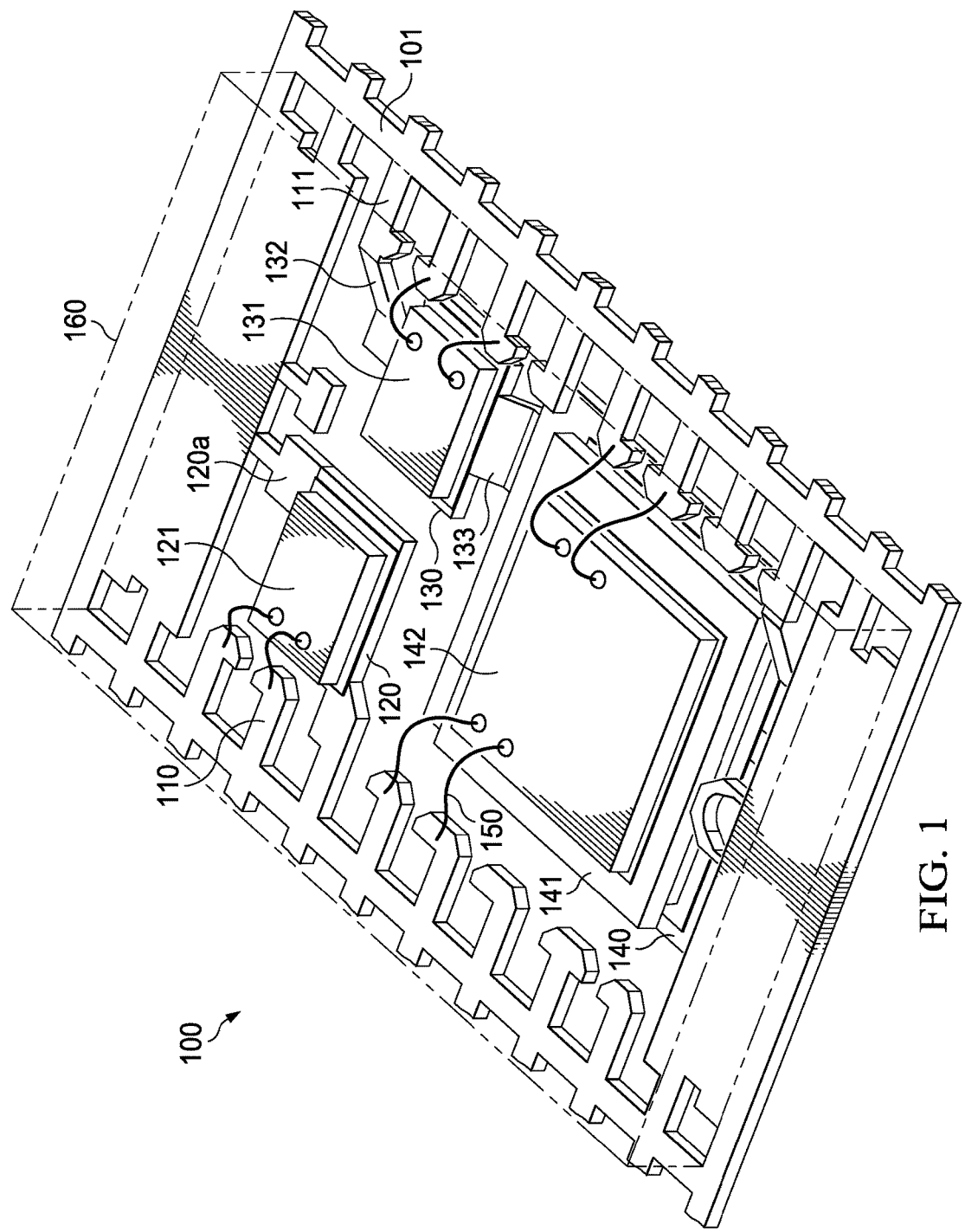
FIG. 1 shows a perspective top view of a leadframe according to an embodiment of the invention, with semiconductor chips attached to pads at different planar levels.
Figure 2:
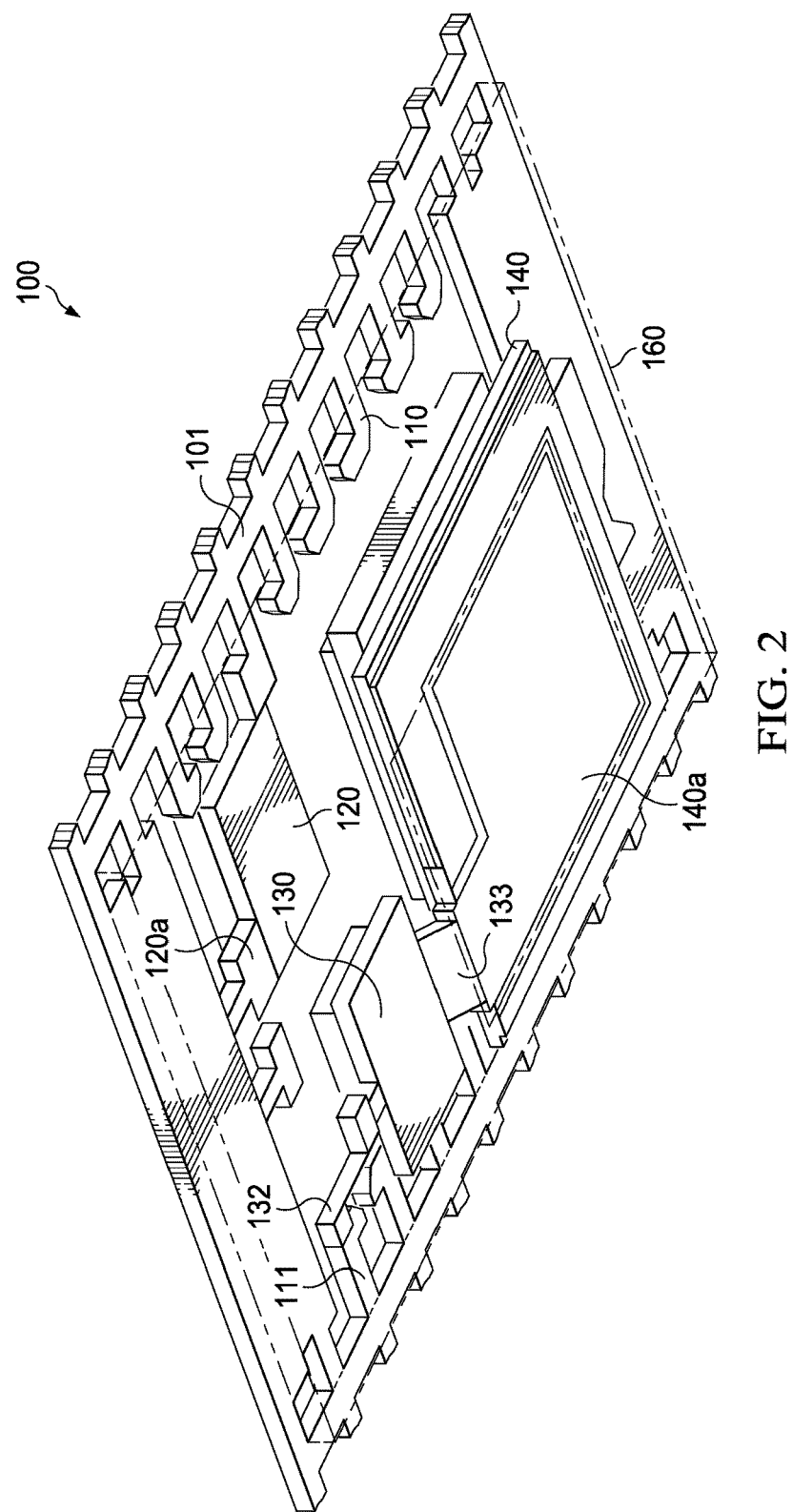
FIG. 2 illustrates a perspective bottom view of the leadframe of FIG. 1, with semiconductor chips attached to pads at different planar levels.
Figure 3:
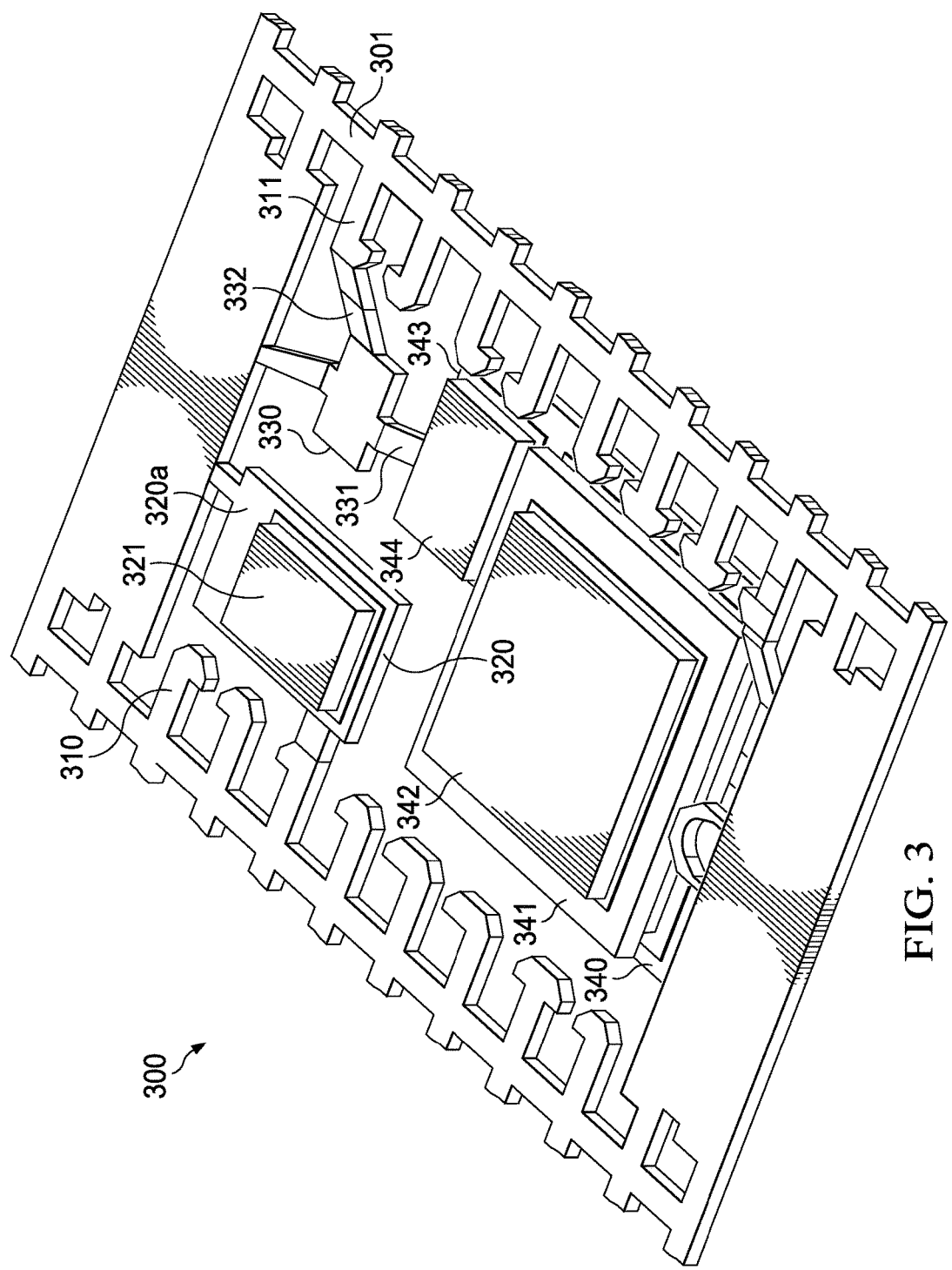
FIG. 3 displays a perspective top view of a leadframe according to another embodiment of the invention, with semiconductor chips attached to pads at different planar levels.

FIG. 1 illustrates in top view an exemplary embodiment of the invention, a leadframe generally designated 100; the same embodiment is shown in FIG. 2 as bottom view. A leadframe 300 as another exemplary embodiment of the invention is illustrated in FIG. 3 in top view and in FIG. 4 in bottom view. Leadframes 100 and 300 serve several needs of semiconductor devices and their operation simultaneously.

Leadframe 100 comprises several portions; one portion is a frame 101, which is made of flat sheet metal. The planar level, or plane, in which frame 101 is situated, is referred to herein as first planar level; frame 101 operates in two dimensions. Respectively, leadframe 300 comprises several portions; one portion is a frame 301 in a first planar level. For manufacturing leadframes in mass production, the complete pattern of frame, pads, leads and support structures is first stamped or etched out of the original flat thin sheet of metal; typical thicknesses are between about 0.25 and 0.15 mm. The first planar level is the plane of the starting sheet of metal. Starting materials include, but are not limited to, copper, copper alloys, aluminum, iron-nickel alloys, and Kovar™.

Referring to FIGS. 1 and 2, frame 101 has a plurality of leads 110 and a first assembly pad 120 extending inward from the frame; leads 110 and pad 120 are in the same first planar level, or plane, as frame 101. First pad 120 is attached to frame 101 by first strap 120a. Based on the fabrication process, leads 110 and first pad 120 are made of the same metal as frame 101. First pad 120 may be suitable for assembling a semiconductor chip 121 or a passive electronic component. In other embodiments, however, there may be more than one assembly pad, and in still other devices, there may be no assembly pad 120 in the first planar level. It is the function of assembly pads 120 to provide stable support for firmly positioning one or more semiconductor chips or passive electronic components. Since the leadframe including the pad is made of electrically conducting material, the pad may be biased, when needed, to any electrical potential required by the network involving the semiconductor device, especially the ground potential.

Figure 4:
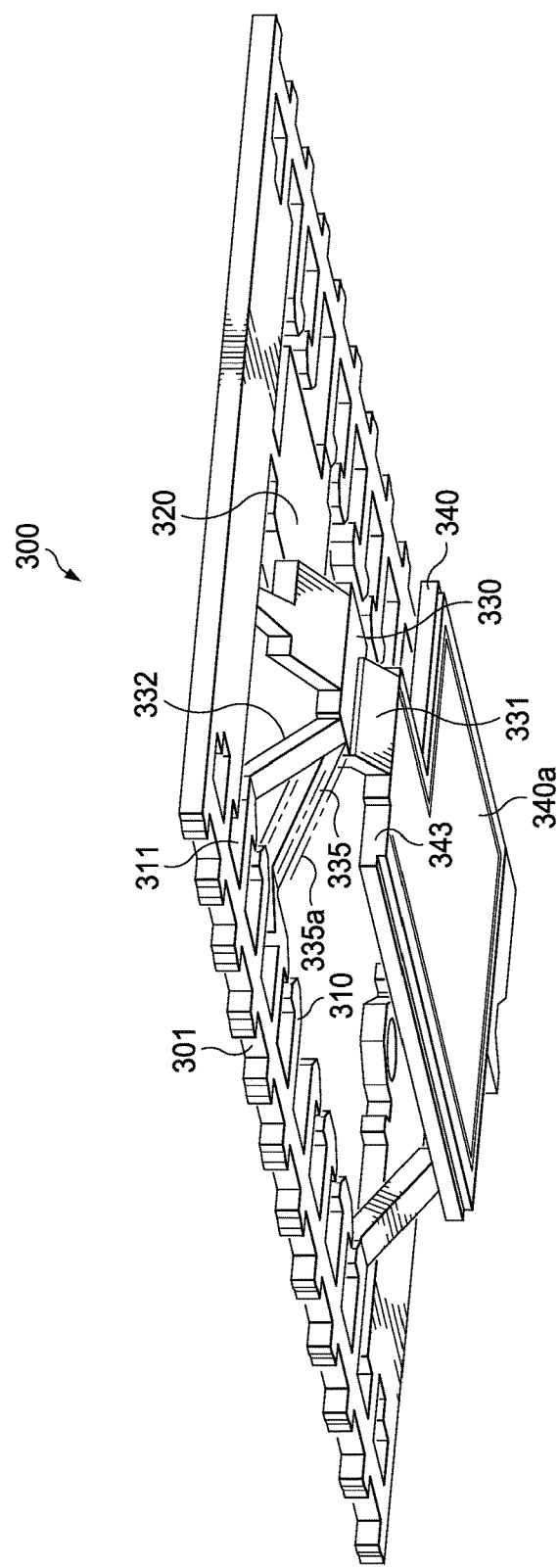
FIG. 4 depicts a perspective bottom view of the leadframe of FIG. 3, with semiconductor chips attached to pads at different planar levels.

Referring now to FIGS. 3 and 4, in analogous fashion frame 301 has a plurality of leads 310 and a first assembly pad 320 extending inward from the frame; leads 310 and pad 320 are in the same first planar level, or plane, as frame 301, and are made of the same metal as frame 301. First pad 320 is attached to frame 301 by first strap 320a. First pad 320 may be operable to assemble and thereafter support a semiconductor chip 321 or a passive electronic component. In other embodiments, however, there may be more than one assembly pad, and in still other devices, there may be no assembly pad 320 in the first planar level.

It is the function of the plurality conductive leads 110 and 310 to bring various electrical lines into close proximity of the chip. The remaining gaps between the tip of the leads and the terminals of the chips are typically bridged by thin wires, individually bonded to the chip terminals and the leads 110 and 310. In FIG. 1, a few of the bonding wires are shown as ball and stitch bond connections and are designated 150.

As FIGS. 1 and 2 indicate, exemplary embodiment 100 further includes a second metallic pad 130 in a second planar level, which is parallel to the first level yet spaced from it by a distance. Similarly in FIGS. 3 and 4, embodiment 300 includes a second metallic pad 330 in a second planar level, which is parallel to the first lever yet spaced from it by a distance. It should be mentioned that herein the distance between the plane of the first level and the plane of the second level is to be considered along an axis vertical to both planes. In FIG. 1, second pad 130 is sized to offer support for a chip 131 and is connected to a lead 111 of leadframe 100 by second strap 132 in order to enable access to a discrete input/output bias for attached chip 131 or passive component, as provided by lead 111. With the help of strap 131, this discrete bias can further be transmitted to third pad 140.

In contrast, in FIG. 3 second pad 330 is designed solely as a support pad for strap 332 at the second planar level; strap 332 is attached to input/output lead 311. Pad 330 in turn is connected to third pad 340 by strap 331; consequently, third pad 340 can be biased at the potential of lead 311. The advantage of introducing interim support level 330 is that without level 330, strap 332 would have to be designed overly long for connecting third pad 340 to lead 311. And it is well known that overly long straps are difficult to handle in the manufacturing processes. Alternatively, straps like strap 332 can be designed in a configuration suitable to accommodate bending and stretching beyond the limit of simple elongation based upon inherent material characteristics. Such configurations may be selected from a group including bent geometry, curved geometry, and toroidal geometry.

As shown by the embodiment in FIGS. 1 and 2, inside frame 101 is a third metallic pad 140 at a third planar level parallel to and spaced from the second level. Since the distances between levels are additive, the third level is even further distant from the first level than the second level. At a matter of fact, it is preferred that third pad 140 is so far removed from the first level of frame 101 that the bottom surface 140a is exposed from a future device package 160 and can thus be used, when having a solderable surface metallurgy, to be solder-attached directly to a board or a heat sink. Third pad 140 may be sized to offer support for one of more semiconductor chips or passive components. In the exemplary embodiment of FIGS. 1 and 2, a vertical stack of two chips 141 and 142 is attached on third pad 140, taking advantage of the deep downset of pad 140 relative to the original first level of the frame.

In analogous fashion, the embodiment depicted in FIGS. 3 and 4 displays a third metallic pad 340 at a third planar level parallel to and spaced from the second level, which accommodates pad 320. Since the distances between levels are additive, the third level is even further distant from the first level than the second level. It is preferred that third pad 340 is so far removed from the first level of frame 301 that the bottom surface 340a is exposed from a future device package and can thus be used, when having a solderable surface metallurgy, to be solder-attached directly to a board or heat sink. Third pad 340 may be sized to offer support for one of more semiconductor chips or passive components. In the exemplary embodiment of FIG. 3, a vertical stack of two chips 341 and 342 is attached on third pad 340, taking advantage of the deep downset of pad 340 relative to the original first level of the frame. In addition, pad 340 has an addition 343, which expands the area of the third pad available for assembling a chip or a passive component 344.

For manufacturing leadframes like 100 and 300 in mass production, the complete pattern of chip pads, leads and support structures is first stamped or etched from the original flat thin sheet of metal. The thicknesses of the starting sheet metal are preferably between about 0.25 and 0.15 mm. Starting materials include, but are not limited to, copper, copper alloys, aluminum, iron-nickel alloys, and Kovar™. In the stamping or etching process, an individual lead and strap of the leadframe takes the form of a thin metallic strip with its particular geometric shape determined by the design. For most purposes, the length of a typical lead and strap is considerably longer than its width.

Then, major parts of the leadframe are clamped in one horizontal plane, while an outside force is applied to the chip pads in order to press them into their new horizontal planes. The straps supporting the chip pads have to absorb this force by stretching; they are "pressed" into their final geometrical shape.

By way of explanation, an outside force, applied along the length of the strap, can stretch the strap in the direction of the length, while the dimension of the width is only slightly reduced, so that the new shape appears elongated. For elongations small compared to the length, and up to a limit, called the elastic limit given by the material characteristics, the amount of elongation is linearly proportional to the force. Beyond that elastic limit, the strap suffers irreversible changes to its inner strength.

As the perspective views in FIGS. 2 and 4 illustrate, the lengths of straps such as 131, 132, and 332 is within the quoted elastic range of elongation (approximately 7 to 8% of original strap length). If more elongation than this elastic limit is required, the needed elongation may be obtained by linearizing a designed-in bending. The contribution of linearizing can be obtained when a topologically long body is first designed and stamped out so that it contains curves, bendings, meanderings or similar non-linearities. An example are configurations selected from a group including bent geometry, curved geometry, and toroidal geometry. By applying force, at least part of the non-linearity is stretched or straightened so that afterwards the body is elongated.

An example of the linearizing of designed-in bending is indicated in FIG. 4 by the strap designated 335. Strap 335 originally had a curved shape indicated by the dashed contours 335a.

Another embodiment of the invention is a semiconductor device such as illustrated in FIGS. 1 and 2. The device includes leadframe 100, semiconductor chips 121, 131, 141, and 142, and a package 160. As discussed above, leadframe 100 comprises a frame 101 of sheet metal in a first planar level, wherein the frame has metallic leads 110 and a first metallic pad 120 extending inward from the frame; the first pad is tied to the frame by first metallic straps 120a. Further, the leadframe includes a second metallic pad 130 in a second planar level parallel to and spaced from the first level; second pad 130 may be tied by second metallic straps to the frame. A third metallic pad 140 is in a third planar level parallel to and spaced from the second level and additively from the first level; third pad 140 tied by third metallic straps 131 to the second pad. It is preferred that the third pad surface 140a facing away from the first pad is solderable. As an example, when pad 140 is made of copper, surface 140a may include a layer of tin or may have a sequence of thin layers made of nickel, palladium, and—optionally—gold.

The terminals of the semiconductor chips are connected to respective leads before the assembly is encapsulated in a package 160. For clarity purpose, FIGS. 1 and 2 show the package as being made of transparent material and in dashed outlines. Preferably the package is made of an epoxy-based compound, which is opaque and encapsulates the chips and bonding wires, the leads, the first and second pad, and portions of the third pad, while it leaves the solderable third pad surface (140a) un-encapsulated and thus exposed to the ambient.

After completing the encapsulation process, the packaged unit undergoes the trimming and forming process steps. In the trimming process, frame 101 is removed so that the individual leads 110 are freed-up. In the forming process, the discrete leads 110 may be bent or otherwise formed to obtain the desired outline so that the completed packaged device can be inserted into or attached to a board.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to products using any type of semiconductor chip, discrete or integrated circuit, and the material of the semiconductor chip may comprise silicon, silicon germanium, gallium arsenide, gallium nitride, or any other semiconductor or compound material used in integrated circuit manufacturing.

As another example, the invention applies to devices with one or more semiconductor chips assembled on the leadframe by attachment and electrical connection.

As yet another example, the invention applies to leadframes with pad planar levels utilized to various degrees for accommodating chips. In some devices, the pads of all levels may populated by chips, in other devices only a the pad of one or few levels. In some devices, a pad may have more than one chip assembled, in other devices one or more pads may be un-populated.

It is therefore intended that the appended claims encompass any such modifications or embodiment.

We claim:

1. A semiconductor device comprising:
   metallic leads and a first metallic pad at a first planar level, extending inward from the metallic leads, the first pad tied to at least a first lead of the metallic leads by a first metallic strap, and a first die attached to the first pad;
   a second metallic pad in a second planar level parallel to and spaced from the first level, the second pad tied by second metallic straps to at least a second lead of the metallic leads, and a second die attached to the second pad;
   a third metallic pad in a third planar level parallel to and spaced from the second level and additively from the first level, the third pad tied by third metallic straps to the second pad, and a third die attached to the third pad; and
   a package covering portions of the first die, the second die, the third die, the metallic leads, the first pad, the second pad, and portions of the third pad, while leaving a surface of the third pad uncovered.

2. The device of claim 1 further including configurations of the first and second straps suitable to accommodate bending and stretching beyond the limit of simple elongation based upon inherent metal characteristics.

3. The device of claim 2, wherein the configurations are selected from a group consisting of bent geometry, curved geometry, and toroidal geometry.

4. The device of claim 1, wherein one or more pads in the first, second, and third planar levels are suitable to serve as mount pads for passive electronic components.

5. The device of claim 1, wherein the surface of the third pad facing away from the first pad is solderable.

6. The device of claim 1, wherein the second pad and third pads are adapted to be biased at a potential of the metallic leads.

7. The device of claim 1, wherein the first die, the second die, and the third die are electrically connected to selected leads of the metallic leads.

8. The device of claim 7, wherein the first die, the second die, and the third die are electrically connected to selected leads of the metallic leads via bond wires.

9. The device of claim 1, wherein the surface of the third pad is exposed from the package.

10. A semiconductor device comprising:
    leads and a first pad at a first planar level, extending inward from the leads, the first pad tied to at least a first lead of the leads by a first strap, and a first die or a first passive component attached to the first pad;
    a second pad in a second planar level parallel to and spaced from the first level, the second pad tied by second straps to at least a second lead of the leads, and a second die or a second passive component attached to the second pad;
    a third pad in a third planar level parallel to and spaced from the second level and additively from the first level, the third pad tied by third straps to the second pad, and a third die or a third passive component attached to the third pad; and a package covering portions of the first die or the first passive component, the second die or the second passive component, the third die or the third passive component, the metallic leads, the first pad, the second pad, and portions of the third pad, while leaving a surface of the third pad uncovered.

11. The device of claim 10, wherein each of the first pad, the second pad, and the third pad are metallic pads.

12. The device of claim 10, wherein each of the first straps, the second straps, and the third straps are metallic straps.

13. The device of claim 10 further including configurations of the first and second straps suitable to accommodate bending and stretching beyond the limit of simple elongation based upon inherent metal characteristics.

14. The device of claim 13, wherein the configurations are selected from a group consisting of bent geometry, curved geometry, and toroidal geometry.

15. The device of claim 10, wherein the third die includes two separate die stacked and attached to the third pad.

16. The device of claim 10, wherein the surface of the third pad is exposed from the package.

* * * * *